(12) United States Patent
Kathirgamanathan

(10) Patent No.: US 6,565,995 B1
(45) Date of Patent: May 20, 2003

(54) ELECTROLUMINESCENT MATERIALS

(75) Inventor: Poopathy Kathirgamanathan, North Harrow (GB)

(73) Assignee: South Bank University Enterprises, Ltd., London (GB)

( * ) Notice: Subject to any disclaimer, the term of this patent is extended or adjusted under 35 U.S.C. 154(b) by 0 days.

(21) Appl. No.: 09/857,286

(22) PCT Filed: Dec. 1, 1999

(86) PCT No.: PCT/GB99/04028

§ 371 (c)(1),
(2), (4) Date: Jun. 1, 2001

(87) PCT Pub. No.: WO00/32718

PCT Pub. Date: Jun. 8, 2000

(30) Foreign Application Priority Data

Dec. 2, 1998 (GB) .............................................. 9826407

(51) Int. Cl.$^7$ .............................................. H05B 33/14
(52) U.S. Cl. ...................... 428/690; 428/917; 313/503; 313/504; 313/506
(58) Field of Search ................................ 428/690, 917; 313/502, 503, 504, 506; 257/102, 103

(56) References Cited

U.S. PATENT DOCUMENTS

| | | | |
|---|---|---|---|
| 4,356,429 A | 10/1982 | Tang ........................... | 313/503 |
| 4,455,364 A | 6/1984 | Sasa ............................ | 430/299 |
| 4,720,432 A | 1/1988 | VanSlyke et al. ........... | 428/457 |
| 4,885,211 A | 12/1989 | Tang et al. .................. | 428/457 |
| 5,128,587 A | 7/1992 | Skotheim et al. ........... | 313/504 |
| 5,281,489 A | 1/1994 | Mori et al. .................. | 428/690 |
| 5,435,937 A | 7/1995 | Bell et al. ............... | 252/301.18 |
| 5,755,999 A | 5/1998 | Shi et al. ................ | 252/301.16 |
| 5,757,026 A | 5/1998 | Forrest et al. ................. | 257/40 |

FOREIGN PATENT DOCUMENTS

| | | |
|---|---|---|
| EP | 0087309 | 8/1983 |
| EP | 0278629 | 8/1988 |
| EP | 0461542 | 12/1991 |
| EP | 0556005 | 8/1993 |
| EP | 0569827 | 11/1993 |
| EP | 0744451 | 11/1996 |
| EP | 0936844 | 8/1999 |
| JP | 61037887 | 2/1986 |
| JP | 1-256584 | 10/1989 |
| JP | 1-282291 | 11/1989 |
| JP | 06145146 | 5/1994 |
| WO | 9802018 | 1/1998 |
| WO | 9855561 | 12/1998 |
| WO | 9858037 | 12/1998 |
| WO | 0026323 | 5/2000 |
| WO | 0032717 | 6/2000 |
| WO | 0032719 | 6/2000 |
| WO | 0044851 | 8/2000 |

OTHER PUBLICATIONS

Y. Hamada, et al., Blue Electroluminescene in Thin Films of Azomethin–Zinc Complexes, Japanese Journal of Applied Physics, 32 pp. L511–L513 (Apr. 1993).

M. Berggren, et al., Ultraviolet Electroluminescene from an Organic Light Emitting Diode, 6156 Advanced Materials 7, No. 11, pp. 900–903 (Nov. 1995).

N. Armaroli, et al., Luminescene properties of Eu3+, Tb3+, and Gd+ complexes of the hexadentate N–donor podand tris[3–(2–pyridyl) pyrazol–lyl] hydroborate, Chemical Physics Letters 276, pp. 435–440 (Sep. 1997).

N.C. Greenham et al., Measurement of absolute photoluminescence quantum effciencies in conjugated polymers, Chemical Physics Letters, 241 pp. 89–96 (Jul. 1995).

L. Liu, et al., Europium complexes as emitters in organic electroluminscent devices, Synthetic Metals, 91, 1997, pp. 267–269 (No Month).

S. Dirr, et al., Luminescence enhancement in microcavity organic multilayer structures, Synthetic Metals, 9, 1997, pp. 53–56 (No Month).

J. Kido, et al., White–Light–Emitting Organic Electroluminescent Device Using Lanthanide Complexes, Japanese Journal of Applied Physics vol. 37, pp. L394–L396 (Mar. 1996).

K. Hensen, et al., Darstellung Von N–BZW. O–Chlormethysilyl–Derivaten der Amine 1,2,3,4–Tetrahydro–1, 10–Phenanthrolin und 8–Hydroxychinolin, Journal of Organometallic Chemistry, 209 (1981), pp. 17–23.

J. Kido, et al., Organic Electroluminscent Devices Using Lanthanide Complexes, Department of Materials Science abd Engineering, Yamagata University, Yamagata Japan, 1995, pp. 110–111, Publication Source not Given.

C.J. Kepert, et al., Structural Systematics of Rare Earth Complexes. V+ the Hydrated 1:1 Adducts of 2,2':6', 2"–Terpyridine with the Lanthanoid (III) Chlorides, Australian Journal of Chemistry, vol. 47, 1994, pp. 365–384.

K. Machida, et al., Redox Behavior and Luminescene Property of Europium Polymer Complexes, Department of Applied Chemistry, Faculty of Engineering, Osaka University, Osaka, Japan, 1991, pp. 70–71, Publication Source not Given. (No Month).

K. Hayashi, et al., Syntheses and Structural Studies of Lanthanide Mixed Ligand Complexes containingB–diketone, Department of Chemistry, Faculty of Science, Ochanomizu University, Tokyo, Japan, 1996, pp. 210–211, Publication Source not Given. (No month).

(List continued on next page.)

*Primary Examiner*—Marie Yamnitzky
(74) *Attorney, Agent, or Firm*—Pitney, Hardin, Kipp & Szuch LLP

(57) ABSTRACT

Tb(TMHD)$_3$OPNP where TMHD is 2,2,6,6-tetramethyl-3,5-heptanedionato and OPNP is diphenylphosphonimide triphenyl phosphorane is an electroluminescent material which emits white light at an applied voltage of above 12 volts.

20 Claims, 3 Drawing Sheets

OTHER PUBLICATIONS

Figure 1:
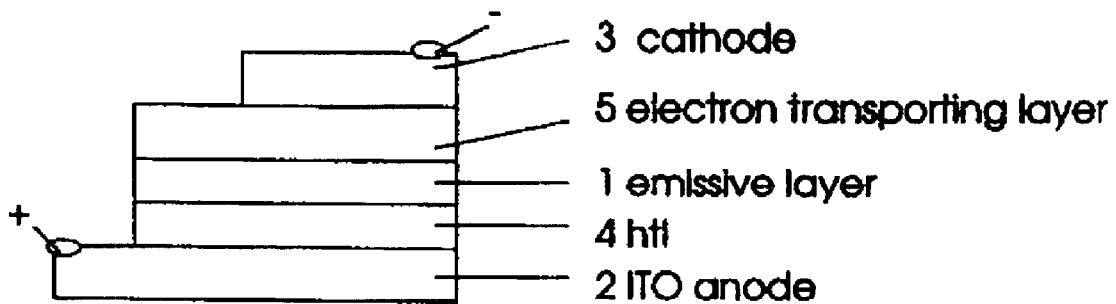

K. Tsuchiya, et al., Complex Formation and its High Dispersion in the Simultaneous Vacuum Deposition of Copper and Phthalocyanine, Faculty of Engineering, Yamagata University, Yomezawa, Japan, 1998, pp. 149–154, Publication Source not Given. (No Month).

L.K. Templeton, et al., Anomalous Scattering by Praseodymium, Samarium and Gadolinium and Structures of their Ethylenediaminetetraacetate (edta) Salts, Acta. Cryst. (1982). B38, pp. 2155–2159. (No Month).

J. Kido, et al., Bright red ligh–emitting organic electrominescent devices having a europium complex as an emitter, Applied Physics Letters, 65. (17), Oct. 1994, pp. 2124–2126.

T. Wakimoto, et al., Organic EL cells with high Luminous efficiency, Applies Surface Science, 113/114 (1997), pp. 698–704. (No Month).

J. Kido, et al., Electroluminscence in a Terbium Complex, Chemistry Letters, The Chemical Society of Japan, 1990, pp. 657–660. (No Month).

Junji Kido, et al. "Multilayer White–Emitting Organic Electroluminescent Device" SCIENCE, Mar. 1995, vol. 267, pp. 1332–1334.

ELECTROLUMINESCENT MATERIALS

This application is a national stage application of PCT/GB99/04028 filed Dec. 1, 1999. PCT/GB99/04028 was published in English under publication number WO 00/32718 on Jun. 8, 2000.

The present invention relates to electroluminescent materials and to devices incorporating them.

Materials, which emit light when an electric current is passed through them, are well known and used in a wide range of display applications. Liquid crystal devices and devices which are based on inorganic semiconductor systems are widely used, however these suffer from the disadvantages of high energy consumption, high cost of manufacture, low quantum-efficiency and the inability to make flat panel displays, reflectance problems, i.e. low visibility in bright conditions and a narrow viewing angle e.g. +/−45°.

Organic polymers have been proposed as useful in electroluminescent devices, but it is not possible to obtain pure colours, they are expensive to make and have a relatively low efficiency.

Another compound, which has been proposed, is aluminium quinolate, but this requires dopants to be used to obtain a range of colours and has a relatively low efficiency.

In an article in Chemistry letters pp 657–660, 1990 Kido et al disclosed that a terbium (III) acetyl acetonate complex was green electroluminescent and in an article in Applied Physics letters 65 (17) Oct. 24, 1994 Kido et al disclosed that a europium (III) triphenylene diamine complexes was red electroluminescent but these were unstable in atmospheric conditions and difficult to produce as films.

The complexes disclosed in these articles had a relatively low photoluminescent efficiency and were only able to produce green or red light and other colours could not be produced.

Production of white light by electroluminescence is difficult to achieve and has required the use of a plurality of different electroluminescent materials either mixed or in sequential layers. Another method of modifying the colour of emitted light is by use of fluorescent dye or dyes mixed with the electroluminescent material or in sequential layers.

In an article by Takco Wakimoto et al in Applied Surface Science 113/114(1997) pages 698–704 electroluminescent cells are disclosed in which aluminium quinolate is used as the emitter and which is doped by quinacrodine derivatives, which are fluorescent dyes, to change the colour of the emitted light.

We have now discovered electroluminescent compounds in which the emitted light can be varied by varying the applied voltage and which can emit white light.

According to the invention there is provided an electroluminescent device in which the electroluminescent compound is Tb(TMHD)$_3$OPNP.

Where TMHD is 2,2,6,6-tetramethyl-3,5-heptanedionato and OPNP is diphenylphosphonimide triphenyl phosphorane.

The colour of light is subjective and colours can be defined by co-ordinates on a two dimensional chart in which colours are areas on the chart and, in the present invention, as well as being observed to be white, white light can be defined as an area in the colour chart CIE 1931.

The electroluminescent compound can be mixed with other transition metal, lanthanide or actinide organic complexes which may change the colour of the emitted light The electroluminescent device comprises a conductive substrate which acts as the anode, a layer of the electroluminescent material and a metal contact connected to the electroluminescent layer which acts as the cathode. When a current is passed through the electroluminescent layer the layer emits light.

The electroluminescent devices of the invention preferably comprise a transparent substrate which is a conductive glass or plastic material which acts as the anode, preferred substrates are conductive glasses such as indium tin oxide coated glass, but any glass which is conductive or has a conductive layer can be used. Conductive polymers and conductive polymer coated glass or plastics materials can also be used as the substrate. The Tb(TMHD)$_3$OPNP can be deposited on the substrate directly by evaporation from a solution in an organic solvent. The solvent which is used can be for example alcohols such as ethanol, ketones such as acetone and methyl acetylacetonate and chlorinated hydrocarbons such as dichloromethane.

Alternatively the material can be deposited by spin coating or by vacuum deposition from the solid state e.g. by sputtering or any other conventional method can be used.

Preferably the Tb(TMHD)$_3$OPNP film is made by mixing Tb(TMHD)$_3$ and OPNP, heating the mixture formed under a vacuum so that the mixture is vaporised and condensing the vapour on to a substrate to form a film or layer of the organo-metallic complex on the substrate. Alternatively the Tb(TMHD)$_3$ and the OPNP can be deposited sequentially on to the substrate.

In one embodiment of the invention there is a hole transporting layer deposited on the transparent substrate and the Tb(TMHD)$_3$OPNP is deposited on the hole transporting layer. The hole transporting layer serves to transport holes and to block the electrons, thus preventing electrons from moving into the electrode without recombining with holes. The recombination of carriers therefore mainly takes place in the emitter layer.

Hole transporting layers are used in polymer electroluminescent devices and any of the known hole transporting materials in film form can be used.

The hole transporting layer can be made of a film of an aromatic amine complex such as poly(vinylcarbazole), N,N'-diphenyl-N,N'-bis(3-methylphenyl)-I,I'-biphenyl-4,4'-diamine (TPD), polyaniline etc.

Optionally dyes such as fluorescent laser dyes, luminescent laser dyes can be included to modify the colour spectrum of the emitted light and also enhance the photoluminescent and electroluminescent efficiencies.

In one embodiment the Tb(TMHD)$_3$OPNP is mixed with a polymeric material such as a polyolefin e.g. polyethylene, polypropylene etc. and preferably polystyrene. Preferred amounts of active material in the mixture is from 95% to 5% by weight of active material and more preferably 25 to 20% by weight.

The hole transporting material can optionally be mixed with the Tb(TMHD)$_3$OPNP in a ratio of 5–95% of the Tb(TMHD)$_3$OPNP to 95 to 5% of the hole transporting compound.

In another embodiment of the invention there is a layer of an electron transporting material between the cathode and the Tb(TMHD)$_3$OPNP layer, this electron transporting layer is preferably a metal complex such as a metal quinolate e.g. an aluminium quinolate which will transport electrons when an electric current is passed through it. Alternatively the electron transporting material can be mixed with the Tb(TMHD)$_3$OPNP and co-deposited with it.

In a preferred structure there is a substrate formed of a transparent conductive material which is the anode on which is successively deposited a hole transportation layer, the Tb(TMHD)$_3$OPNP layer and an electron transporting layer which is connected to the cathode. The cathode can be any low work function metal e.g. aluminium, calcium, lithium, silver/magnesium alloys etc.

At lower voltages e.g. below 10 volts the emitted light principally is yellowish green and corresponds to the typical colour of emitted light of terbium III complexes and, as the voltage is increased, the emitted light becomes nearer a white colour and at a voltage of over 12 volts it appears white to the eye.

Possibly the wavelength of the emitted light changes due to an increase in the strength of the radiation due to the ligands which emit light of a shorter wavelength with increase of voltage so the overall effect is a combination of the contributions from the various moieties in the complex and its interaction with the hole transporting layer.

It is very surprising that this effect can give rise to white light.

The invention is described in the Examples.

EXAMPLE 1

(i) Thin Film Tb(TMHD)$_3$OPNP 50 mg of Tb(TMHD)$_3$ ($7\times10^{-5}$ moles) and 33.68 mg of OPNP 33.68 mg($7.05\times10^{-5}$ moles) were ground together in a mortar and pestle and a 3 mg portion was placed on a molybdenum boat in an Edwards(E306) vacuum coater. Spectrosil slides (UV grade) were secured on a sample holder. The vacuum coater was evacuated to $10^{-7}$ torr and the sample was heated using an electrical heater at 10 to 90 A and 10V for up to twenty seconds to give a film of Tb(TMHD)$_3$ OPNP.

(ii) Fabrication of an Electroluminescent Devices Based on Tb(TMHD)$_3$ OPNP A 3 mg mixture of Tb(TMHD)$_3$OPNP prepared as in (i) was evaporated onto a p patterned ITO electrode (2) to give a film (1) of 50 nm thickness. The patterned ITO had been previously coated with 20 nm of a hole transporting layer (4) formed of TPD. Aluminum quinolate (Alq$_3$) was then evaporated on top of the layer to give a film of 20 nm thickness to act as an electron-transporting layer (5). An aluminum top contact (3) (900 nm) was made to form the structure of FIG. 1 of the drawings.

Figure 2A:
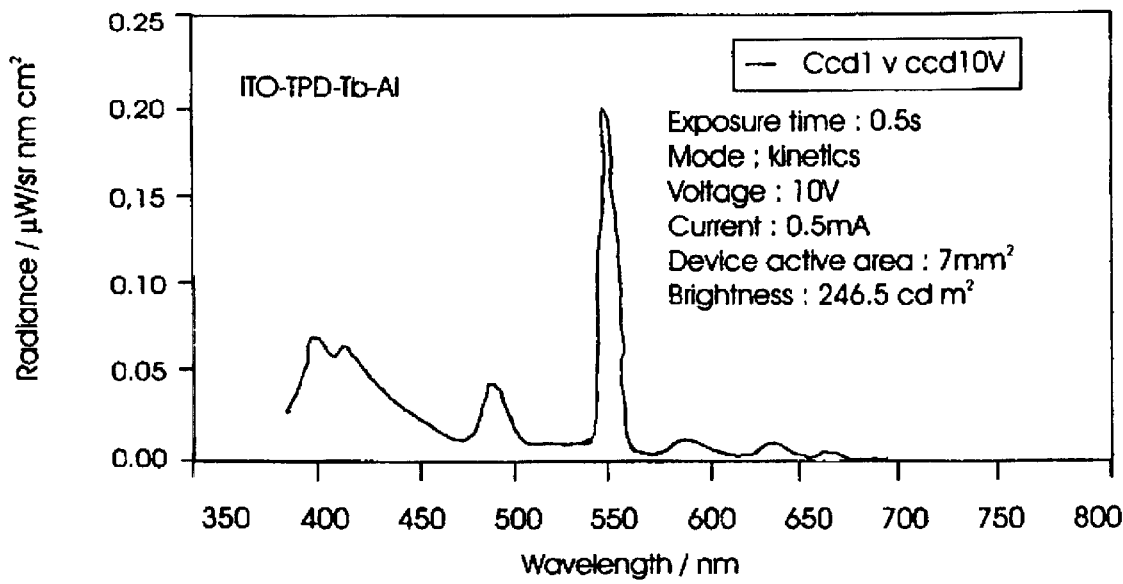
Figure 2B:
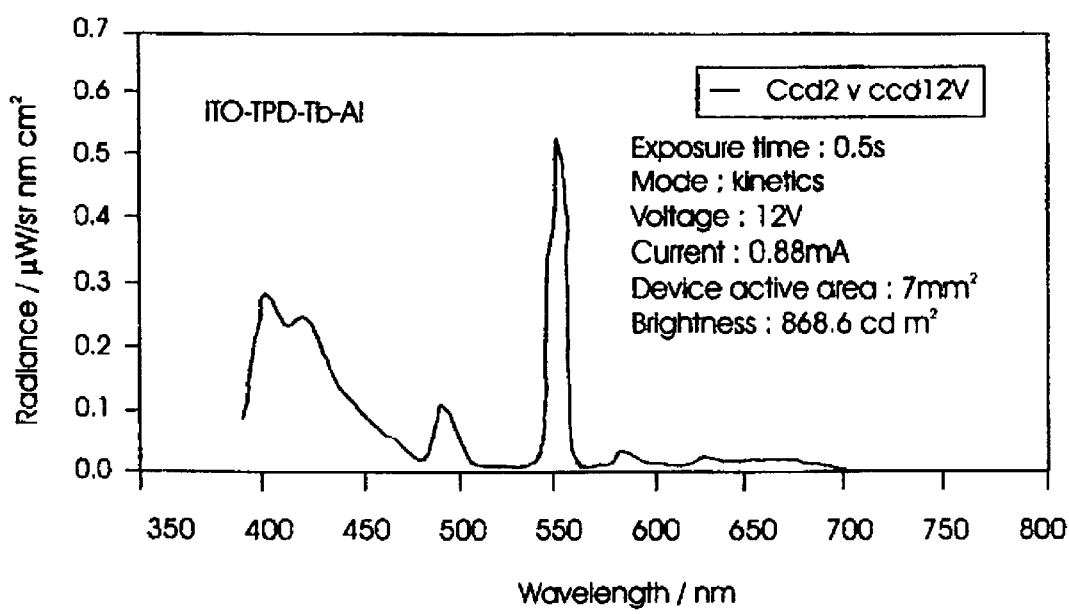
Figure 2C:
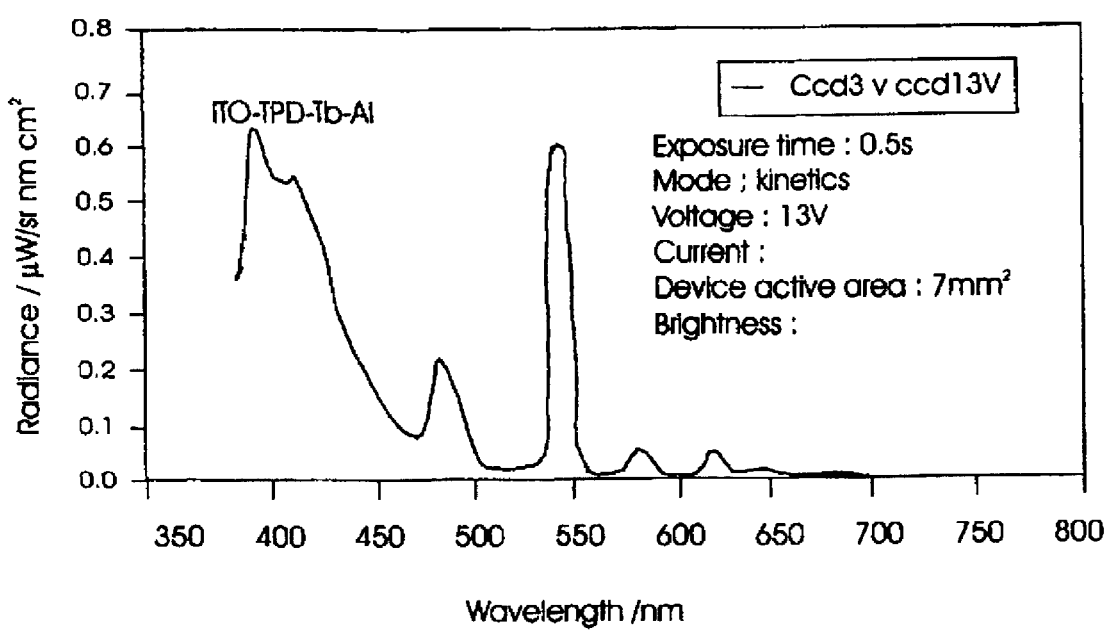

A measured voltage was passed across the device and the wavelength of the emitted light measured. The results are shown in FIGS. 2a, 2b and 2c. As can be seen, with increasing voltage the intensity of the light at wavelengths other than the peak due to Tb increases and this causes the emitted light to become white in the spectra of 2c and the colour coordinates of the light emitted in FIG. 2c in the colour chart CIE 1931 was x:0.22, y:0.25, which is white light.

What is claimed is:

1. An electroluminescent device including an anode, a cathode and an electroluminescent layer comprising Tb(TMHD)$_3$OPNP where TMHD is 2,2,6,6-tetramethyl-3,5-heptanedionato and OPNP is diphenylphosphonimide triphenyl phosphorane.

2. An electroluminescent device which comprises a conductive substrate which acts as an anode, an electroluminescent layer comprising Tb(TMHD)$_3$OPNP where TMHD is 2,2,6,6-tetramethyl-3,5-heptanedionato and OPNP is diphenylphosphonimide triphenyl phosphorane and a metal contact connected to the electroluminescent layer which acts as a cathode.

3. An electroluminescent device as claimed in claim 2, in which the Tb(TMHD)$_3$OPNP is deposited on the substrate directly by evaporation from a solution in an organic solvent.

4. An electroluminescent device as claimed in claim 2, in which the Tb(TMHD)$_3$OPNP is deposited on the substrate by spin coating or by vacuum deposition from the solid state.

5. An electroluminescent device as claimed in claim 2, in which a Tb(TMHD)$_3$OPNP layer is formed by the process of mixing Tb(TMHD)$_3$ and OPNP, heating the mixture formed under a vacuum so that the mixture is vaporised and condensing the vapour on to a substrate to form a film or layer of the Tb(TMHD)$_3$OPNP on the substrate.

6. An electroluminescent device as claimed in claim 5 further comprising a layer of an electron transporting material between the cathode and the Tb(TMHD)$_3$OPNP layer.

7. An electroluminescent device as claimed in claim 6 wherein the electron transporting material is aluminium quinolate.

8. An electroluminescent device as claimed in claim 5 wherein the electroluminescent layer comprises an electron transporting material mixed with the Tb(TMHD)$_3$OPNP.

9. An electroluminescent device as claimed in claim 5 which comprises a substrate formed of a transparent conductive material which is the anode on which is successively deposited a hole transportation layer, the Tb(TMHD)$_3$OPNP layer and an electron transporting layer which is connected to the metal cathode.

10. An electroluminescent device as claimed in claim 2 in which a Tb(TMHD)$_3$OPNP layer is made by the process of sequential deposition of Tb(TMHD)$_3$ and the OPNP on to the substrate.

11. An electroluminescent device as claimed in claim 2 wherein the substrate is transparent, further comprising a hole transporting layer deposited on the transparent substrate, wherein the Tb(TMHD)$_3$OPNP is deposited on the hole transporting layer.

12. An electroluminescent device as claimed in claim 11 in which the hole transporting layer is selected from the group consisting of poly(vinylcarbazole), N,N'-diphenyl-N,N'-bis(3-methylphenyl)-1,1'-biphenyl-4,4'-diamine (TPD) and polyaniline.

13. An electroluminescent device as claimed in claim 2 wherein a hole transporting compound is mixed with the Tb(TMHD)$_3$OPNP in a ratio of 5–95% by weight of the Tb(TMHD)$_3$OPNP to 95 to 5% by weight of the hole transporting compound.

14. An electroluminescent device as claimed in claim 13, in which the hole transporting compound is selected from the group consisting of poly(vinylcarbazole), N,N'-diphenyl-N,N'-bis(3-methylphenyl)-1,1'-biphenyl-4,4'-diamine (TPD) and polyaniline.

15. An electroluminescent device as claimed in claim 2 further comprising a dye.

16. An electroluminescent device as claimed in claim 2 in which the Tb(TMHD)$_3$OPNP is mixed with a polyolefin and wherein the amount of Tb(TMHD)$_3$OPNP in the mixture is from 95% to 5% by weight of the mixture.

17. An electroluminescent device as claimed in claim 2 further comprising a layer of an electron transporting material between the cathode and the Tb(TMHD)$_3$OPNP layer.

18. An electroluminescent device as claimed in claim 17 in which the electron transporting material is aluminium quinolate.

19. An electroluminescent device as claimed in claim 2 wherein the electroluminescent layer comprises an electron transporting material mixed with the Tb(TMHD)$_3$OPNP.

20. An electroluminescent device as claimed in claim 2 which comprises a substrate formed of a transparent conductive material which is the anode on which is successively deposited a hole transportation layer, the Tb(TMHD)$_3$OPNP layer and an electron transporting layer which is connected to the cathode.

* * * * *